United States Patent
Shimada et al.

(10) Patent No.: US 9,224,869 B2
(45) Date of Patent: Dec. 29, 2015

(54) SEMICONDUCTOR DEVICE AND METHOD FOR MANUFACTURING SAME

(71) Applicant: Sharp Kabushiki Kaisha, Osaka-shi, Osaka (JP)

(72) Inventors: Yukimine Shimada, Osaka (JP); Hirohiko Nishiki, Osaka (JP); Kenichi Kitoh, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/427,401

(22) PCT Filed: Sep. 9, 2013

(86) PCT No.: PCT/JP2013/074250
§ 371 (c)(1),
(2) Date: Mar. 11, 2015

(87) PCT Pub. No.: WO2014/042125
PCT Pub. Date: Mar. 20, 2014

(65) Prior Publication Data
US 2015/0206979 A1 Jul. 23, 2015

(30) Foreign Application Priority Data
Sep. 12, 2012 (JP) ................................. 2012-200319

(51) Int. Cl.
*H01L 29/786* (2006.01)
*H01L 27/12* (2006.01)
(Continued)

(52) U.S. Cl.
CPC ...... *H01L 29/7869* (2013.01); *H01L 21/02609* (2013.01); *H01L 21/441* (2013.01);
(Continued)

(58) Field of Classification Search
CPC .................. H01L 29/7869; H01L 29/66765; H01L 29/41733; H01L 27/124
USPC ..................... 257/43–50, E21.414, E21.415; 438/149–167
See application file for complete search history.

(56) References Cited

U.S. PATENT DOCUMENTS

2002/0109796 A1\* 8/2002 Lin et al. .......................... 349/43
2004/0056251 A1 3/2004 Kim et al.
(Continued)

FOREIGN PATENT DOCUMENTS

JP 2004-056153 A 2/2004
JP 2010-243594 A 10/2010
(Continued)

OTHER PUBLICATIONS
Official Communication issued in International Patent Application No. PCT/JP2013/074250, mailed on Oct. 29, 2013.

*Primary Examiner* — Brook Kebede
(74) *Attorney, Agent, or Firm* — Keating & Bennett, LLP

(57) ABSTRACT

This semiconductor device (101) includes: a substrate (1); a thin-film transistor (10) which includes an oxide semiconductor layer (6) as its active layer; a protective layer (11) covering the thin-film transistor; a metal layer (9d, 9t) interposed between the protective layer (11) and the substrate (1); a transparent conductive layer (13, 13t) formed on the protective layer (11); and a connecting portion (20, 30) to electrically connect the metal layer (9d, 9t) and the transparent conductive layer (13, 13t) together. The connecting portion (20, 30) includes an oxide connecting layer (6a, 6t) which is formed out of a same oxide film as a oxide semiconductor layer (6) and which has a lower electrical resistance than the oxide semiconductor layer (6). The metal layer (9d, 9t) is electrically connected to the transparent conductive layer (13, 13t) via the oxide connecting layer (6a, 6t).

18 Claims, 8 Drawing Sheets

(51) Int. Cl.
*H01L 21/02* (2006.01)
*H01L 21/441* (2006.01)
*H01L 29/24* (2006.01)
*H01L 29/417* (2006.01)
*H01L 29/66* (2006.01)
*G02F 1/1368* (2006.01)
*H01L 23/532* (2006.01)

(52) U.S. Cl.
CPC .......... *H01L27/124* (2013.01); *H01L 27/1225* (2013.01); *H01L 27/1259* (2013.01); *H01L 29/24* (2013.01); *H01L 29/41733* (2013.01); *H01L 29/66969* (2013.01); *H01L 29/78606* (2013.01); *G02F 1/1368* (2013.01); *G02F 2201/50* (2013.01); *H01L 23/53223* (2013.01); *H01L 2924/0002* (2013.01)

(56) References Cited

U.S. PATENT DOCUMENTS

| | | |
|---|---|---|
| 2010/0227442 A1* | 9/2010 | Lu et al. .................. 438/158 |
| 2012/0108018 A1 | 5/2012 | Okabe et al. |
| 2012/0138922 A1 | 6/2012 | Yamazaki et al. |
| 2013/0001546 A1 | 1/2013 | Kamada et al. |
| 2013/0215370 A1 | 8/2013 | Takanishi et al. |

FOREIGN PATENT DOCUMENTS

| | | |
|---|---|---|
| JP | 2012-134475 A | 7/2012 |
| WO | 2011/010415 A1 | 1/2011 |
| WO | 2011/118515 A1 | 9/2011 |
| WO | 2012/023226 A1 | 2/2012 |

* cited by examiner (a)

(b)

(c)

(d)

(e)

(f)

(g)

# US 9,224,869 B2

SEMICONDUCTOR DEVICE AND METHOD FOR MANUFACTURING SAME

TECHNICAL FIELD

The present invention relates to a semiconductor device which is formed using an oxide semiconductor and a method for fabricating such a device, and more particularly relates to an active-matrix substrate for use in a liquid crystal display device or an organic EL display device and a method for fabricating such a substrate. In this description, the "semiconductor devices" include an active-matrix substrate and a display device which uses the active-matrix substrate.

BACKGROUND ART

An active-matrix substrate for use in a liquid crystal display device and other devices includes switching elements such as thin-film transistors (which will be hereinafter referred to as "TFTs"), each of which is provided for an associated one of pixels.

As for TFTs, a TFT which uses an amorphous silicon film as its active layer (and will be hereinafter referred to as an "amorphous silicon TFT") and a TFT which uses a polysilicon film as its active layer (and will be hereinafter referred to as a "polysilicon TFT") are used extensively.

Recently, people have proposed that an oxide semiconductor be used as a material for the active layer of a TFT instead of amorphous silicon or polysilicon. Such a TFT will be hereinafter referred to as an "oxide semiconductor TFT". Since an oxide semiconductor has higher mobility than amorphous silicon, the oxide semiconductor TFT can operate at higher speeds than an amorphous silicon TFT. Also, such an oxide semiconductor film can be formed by a simpler process than a polysilicon film.

An active-matrix substrate including TFTs as switching elements is called a "TFT substrate". On a TFT substrate, the drain electrode of each TFT is connected to its associated pixel electrode. A transparent conductive film of ITO (indium tin oxide) or IZO (indium zinc oxide), for example, is generally used to make the pixel electrodes. Their source and drain electrodes, as well as source lines, are generally formed out of the same conductive film. As the conductive film, a film with a high degree of conductivity such as an aluminum (Al) film is suitably used. However, if the Al film were allowed to contact with the semiconductor layer of a TFT, Al would diffuse inside the semiconductor layer too much to achieve intended TFT performance in some cases. In addition, in a configuration in which the Al film is allowed to contact with ITO or any other material that makes the pixel electrodes, there is so significant a difference in ionization tendency (or standard electrode potential) between Al and ITO that Al could get corroded electrolytically during the wet etching process of ITO and the contact resistance might rise eventually. Such a problem arises not only when an Al film is used but also when another metal that could cause the electrolytic corrosion reaction to a transparent conductive material such as ITO is used as an electrode or line material.

To overcome such a problem, Patent Document No. 1 teaches using a stack including an Al film and a barrier metal film as source and drain electrodes.

FIG. 9 illustrates a part of the cross-sectional structure of the TFT substrate disclosed in Patent Document No. 1.

In the TFT substrate disclosed in Patent Document No. 1, each TFT 190 includes a gate electrode 123, a gate insulating film 140, a semiconductor layer 154 of amorphous silicon, and source and drain electrodes 173, 175. The source and drain electrodes 173 and 175 are electrically connected to the semiconductor layer 154 via contact portions 163 and 165, respectively. The TFT 190 is covered with a protective film 180. A pixel electrode 185 of ITO or IZO, for example, is formed on the protective film 180. The pixel electrode 185 is in contact with the drain electrode 175 inside a contact hole formed in the protective film 180.

In the TFT substrate of Patent Document No. 1, the source and drain electrodes 173 and 175 each have a multilayer structure including a lower film 173p, 175p of a barrier metal and an upper film 173q, 175q of aluminum or an aluminum alloy. The upper film 173q, 175q is removed partially so that the lower film 173p, 175p is exposed at both ends of the semiconductor layer 154. The pixel electrode 185 is in contact with the lower film 175p of the drain electrode 175 inside the contact hole.

According to the configuration shown in FIG. 9, the lower film 173p, 175p of a barrier metal is interposed between the upper film 173q, 175q of Al and the semiconductor layer 154, and therefore, Al can be prevented from diffusing so far as to enter the semiconductor layer 154. In addition, since a portion of the upper film 175q of Al is removed from a region where the pixel electrode 185 and the drain electrode 175 are connected together, it is possible to prevent contact between Al and ITO from causing electrolytic corrosion of Al.

CITATION LIST

Patent Literature

Patent Document No. 1: Japanese Laid-Open Patent Publication No. 2004-056153

SUMMARY OF INVENTION

Technical Problem

In the TFT substrate of Patent Document No. 1, to form source and drain electrodes, after the lower and upper films are patterned simultaneously, only the upper film needs to be patterned so that the lower film is partially exposed. As a result, the number of photomasks to use increases and the manufacturing process gets complicated, which is a problem.

Thus, an object of the present invention is to provide a semiconductor device which can minimize the electrolytic corrosion of a metal included in an electrode or a line without complicating the manufacturing process and which can achieve excellent TFT performance and also provide a method for fabricating such a semiconductor device.

Solution to Problem

A semiconductor device according to an embodiment of the present invention includes: a substrate; a thin-film transistor which is supported on the substrate and which includes an oxide semiconductor layer as its active layer; a protective layer covering the thin-film transistor; a metal layer interposed between the protective layer and the substrate; a transparent conductive layer formed on the protective layer; and a connecting portion to electrically connect the metal layer and the transparent conductive layer together. The connecting portion includes an oxide connecting layer which is formed out of a same oxide film as the oxide semiconductor layer and which has a lower electrical resistance than the oxide semiconductor layer. The metal layer is electrically connected to the transparent conductive layer via the oxide connecting layer.

In one embodiment, the protective layer has a hole portion which is located over the oxide connecting layer, and the transparent conductive layer is in contact with the oxide connecting layer inside the hole portion of the protective layer. In one embodiment, in the connecting portion, the transparent conductive layer is not directly in contact with the metal layer.

In one embodiment, the metal layer has a hole over the oxide connecting layer and a sidewall of the hole is covered with the protective layer.

In one embodiment, the connecting portion is a drain-pixel electrode connecting portion, the metal layer is a drain electrode of the thin film transistor, and the transparent conductive layer is a pixel electrode.

In one embodiment, the connecting portion is a terminal portion, and the metal layer is a source connecting layer which is formed out of a same conductive film as source and drain electrodes of the thin film transistor.

In one embodiment, the metal layer includes a metal which is able to cause electrolytic corrosion reaction with the transparent conductive layer.

In one embodiment, the metal layer includes aluminum.

In one embodiment, the metal layer has a multilayer structure including a lower layer including a barrier metal and an upper layer including aluminum.

In one embodiment, the oxide semiconductor layer and the oxide connecting layer include In, Ga and Zn.

In one embodiment, the oxide semiconductor layer and the oxide connecting layer include a crystalline In—Ga—Zn—O based oxide.

In one embodiment, the thin-film transistor further includes an etch stop layer which is in contact with a channel region of the oxide semiconductor layer.

A semiconductor device fabricating method according to an embodiment of the present invention is a method for fabricating a semiconductor device according to any of the embodiments described above. The method includes the steps of: (A) providing a substrate, on which a gate electrode and a gate insulating layer are formed; (B) forming an oxide semiconductor film on the gate insulating layer and patterning the oxide semiconductor film, thereby forming a first oxide semiconductor layer to be an active layer for a thin-film transistor and a second oxide semiconductor layer to be an oxide connecting layer; (C) forming a metal layer to cover the second oxide semiconductor layer partially; (D) forming a protective layer over the metal layer and forming, in the protective layer, a hole portion exposing at least partially a portion of the second oxide semiconductor layer that is not covered with the metal layer; (E) performing a resistance lowering process to lower the resistance of that portion of the second oxide semiconductor layer that is exposed by the hole portion, thereby turning the second oxide semiconductor layer into an oxide connecting layer; and (F) forming a transparent conductive film over the protective layer and inside the hole portion and patterning the transparent conductive film, thereby forming a transparent conductive layer to contact with the oxide connecting layer inside the hole portion.

A semiconductor device fabricating method according to another embodiment of the present invention is a method for fabricating a semiconductor device including an etch stop layer according to an embodiment described above. The method includes the steps of: (a) providing a substrate, on which a gate electrode and a gate insulating layer are formed; (b) forming an oxide semiconductor film on the gate insulating layer and patterning the oxide semiconductor film, thereby forming a first oxide semiconductor layer to be an active layer for a thin-film transistor and a second oxide semiconductor layer to be an oxide connecting layer; (c) forming an etch stop layer to contact with the first oxide semiconductor layer at least partially; (d) performing a resistance lowering process to lower the resistance of the second oxide semiconductor layer, thereby turning the second oxide semiconductor layer into an oxide connecting layer; (e) forming a metal layer to cover the oxide connecting layer partially; (f) forming a protective layer over the metal layer and forming, in the protective layer, a hole portion exposing at least partially a portion of the oxide connecting layer that is not covered with the metal layer; and (g) forming a transparent conductive film over the protective layer and inside the hole portion and patterning the transparent conductive film, thereby forming a transparent conductive layer to contact with the oxide connecting layer inside the hole portion.

Advantageous Effects of Invention

According to an embodiment of the present invention, in a semiconductor device including a TFT which uses an oxide semiconductor layer as its active layer, the electrolytic corrosion of a metal included in an electrode or a line can be minimized without complicating the manufacturing process.

BRIEF DESCRIPTION OF DRAWINGS

FIG. 6 An exemplary enlarged cross-sectional view illustrating the drain-pixel electrode connecting layer 6a.

DESCRIPTION OF EMBODIMENTS

Figure 1:
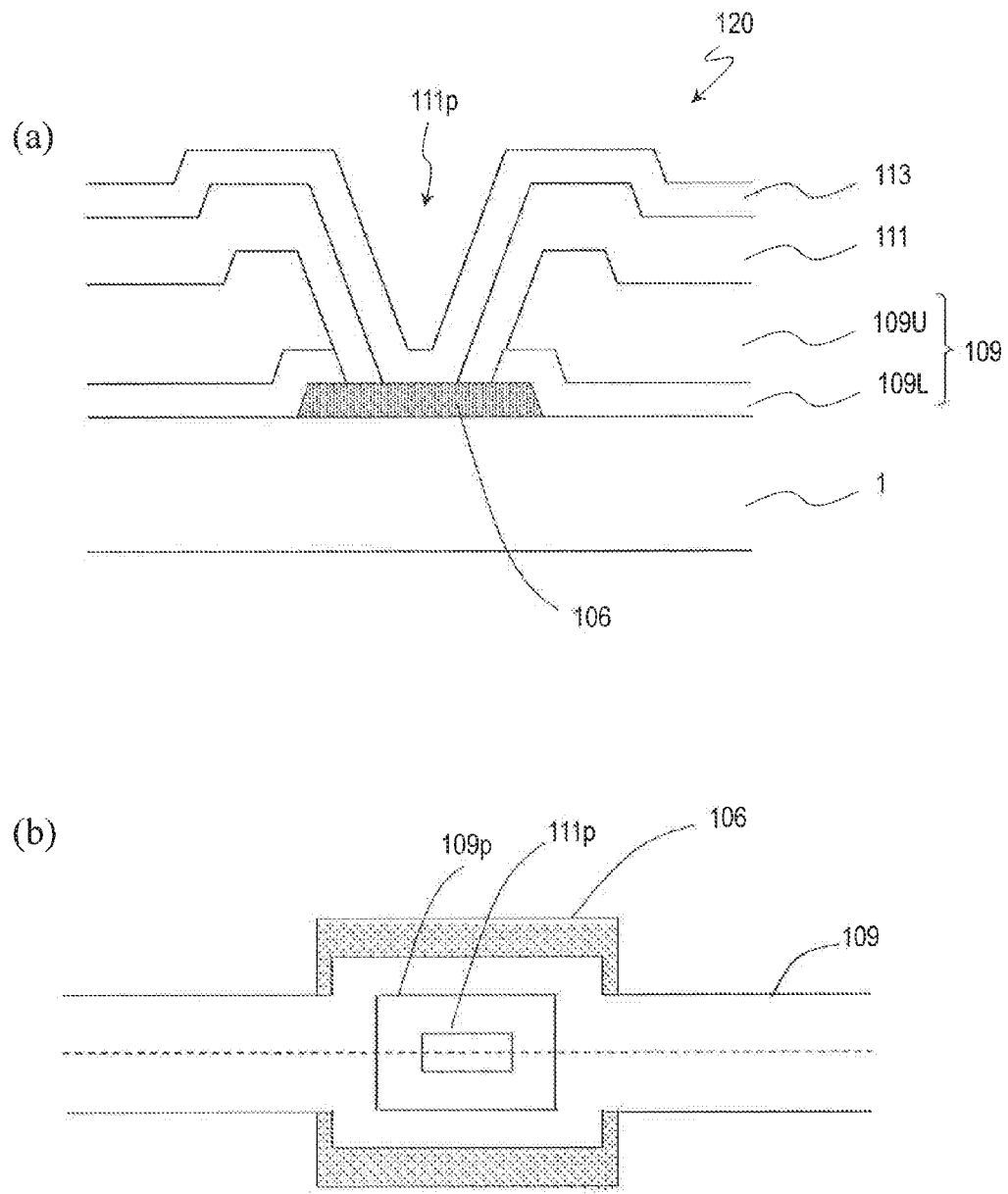
FIGS. 1 (a) and (b) are respectively a cross-sectional view and a plan view illustrating a connecting portion for use in a semiconductor device according to an embodiment of the present invention.

The present inventors carried out researches to find a structure that could suppress the electrolytic corrosion of a metal to be caused at a connecting portion between a metal layer including a metal such Al and a transparent conductive layer made of ITO, for example, in a semiconductor device including an oxide semiconductor TFT. As a result, the present inventors discovered that if an oxide layer which had been formed out of the same oxide film as the oxide semiconductor layer of TFTs (and which will be hereinafter referred to as an "oxide connecting layer") was used, such an electrolytic corrosion problem could be overcome without increasing the manufacturing cost or the number of photomasks to use, thus perfecting our invention.

In this description, the "metal layer" refers herein to a layer including a metal such as Al that could cause an electrolytic corrosion reaction with a transparent conductive layer and may be in any various forms including electrodes and lines. On the other hand, the "connecting portion" refers herein to a portion which connects together a metal layer and a transparent conductive layer provided over a TFT, and may be a connecting portion to connect a drain electrode and a pixel electrode together (which will be hereinafter referred to as a "drain-pixel electrode connecting portion"), a terminal portion or any of various other portions. At the terminal portion, a source connecting layer which is formed integrally with, or out of the same layer as, the source line and an upper connecting portion formed out of the same transparent conductive film as the pixel electrode are connected together.

The configuration of such a connecting portion in a semiconductor device according to an embodiment of the present invention will now be described with reference to the accompanying drawings.

FIGS. 1(a) and 1(b) are respectively a cross-sectional view and a plan view illustrating a connecting portion 120 for use in a semiconductor device according to an embodiment of the present invention. A semiconductor device according to this embodiment includes a substrate 1, a TFT (not shown) which is supported on the substrate 1 and which includes an oxide semiconductor layer as its active layer, an oxide connecting layer 106 formed out of the same oxide film as the oxide semiconductor layer, a protective layer 111 covering the TFT, a metal layer 109 interposed between the protective layer 111 and the substrate 1, and a transparent conductive layer 113 formed over the protective layer 111. This semiconductor device includes a connecting portion 120 to electrically connect the metal layer 109 and the transparent conductive layer 113 together. In the connecting portion 120, the metal layer 109 is electrically connected to the transparent conductive layer 113 via the oxide connecting layer 106.

By adopting such a configuration, the electrolytic corrosion of a metal due to contact between the metal layer 109 and the transparent conductive layer 113 can be suppressed without increasing the manufacturing cost or the number of photomasks to use.

The oxide connecting layer 106 is a layer including a low resistance region which has lower electrical resistance than the oxide semiconductor layer of the TFT. The oxide connecting layer 106 may be formed by subjecting the oxide semiconductor film to a resistance lowering process, for example. As will be described later, by patterning an oxide semiconductor film, a first oxide semiconductor layer to be an active layer for a TFT and a second oxide semiconductor layer to be an oxide connecting layer may be formed, and then the second oxide semiconductor layer may be subjected to a resistance lowering process with the first oxide semiconductor layer masked. In this manner, an oxide connecting layer with lower resistance than the first oxide semiconductor layer can be formed.

The metal layer 109 may be either a TFT's drain electrode or a line or connecting layer which is formed out of the same conductive film as the source and drain electrodes.

The connecting portion 120 may be a drain-pixel electrode connecting portion, for example. In this case, the metal layer 109 is a drain electrode and the transparent conductive layer 113 is a pixel electrode. The oxide connecting layer 106 becomes a connecting layer to connect the drain electrode and the pixel electrode together (and will be hereinafter referred to as a "drain-pixel electrode connecting layer"). Alternatively, the connecting portion 120 may also be a terminal portion. If the connecting portion 120 is a source terminal portion, the metal layer 109 may be a source connecting layer which is formed integrally with a source line, and the transparent conductive layer 113 may be an upper connecting layer which is formed out of the same transparent conductive film as the pixel electrode. The semiconductor device of this embodiment needs to include at least one of the connecting portions 120 with these configurations. However, if the drain-pixel electrode connecting portion and terminal portion both have the configuration described above, the electrolytic corrosion can be suppressed even more effectively, which is advantageous to carry out the process smoothly.

In the example shown in FIG. 1, the protective layer 111 has a hole portion 111p which is located over the oxide connecting layer 106, and the transparent conductive layer 113 is in contact with the oxide connecting layer 106 inside the hole portion 111p of the protective layer 111. According to such a configuration, the resistance lowering process to obtain the oxide connecting layer 106 may be performed with the protective layer 111 used as a mask as will be described later.

If the connecting portion 120 is formed so that the transparent conductive layer 113 is not directly in contact with the metal layer 109, the electrolytic corrosion of the metal can be suppressed even more effectively. For example, the metal layer 109 may have a hole 109p, which is located over the oxide connecting layer 106 and the sidewall of which may be covered with the protective layer 111.

The metal film to form the source electrode and the metal layer 109 includes a metal which could cause an electrolytic corrosion reaction with the transparent conductive layer 113. Examples of such metals include aluminum, an aluminum alloy and magnesium (Mg). Considering its high degree of conductivity and machinability, the metal film suitably includes aluminum.

In the example illustrated in FIG. 1, a stack consisting of a lower layer 109L including a barrier metal and an upper layer 109U including a metal (such as aluminum) which could cause an electrolytic corrosion reaction is used as the metal film. As a result, the contact resistance between the TFT's oxide semiconductor layer and source and drain electrodes can be reduced to a sufficiently low level and diffusion of a metal such as aluminum into the oxide semiconductor layer can be suppressed.

A semiconductor device as an embodiment of the present invention will now be described more specifically with reference to the accompanying drawings as being applied to a TFT substrate for use in a liquid crystal display device. A semiconductor device according to this embodiment includes a thin-film transistor which has an active layer made of an oxide semiconductor (and which will be hereinafter referred to as an "oxide semiconductor TFT"). A semiconductor device according to this embodiment just needs to include an oxide semiconductor TFT and may be implemented broadly as an active-matrix substrate or any of various kinds of display devices and electronic devices.

Figure 2:
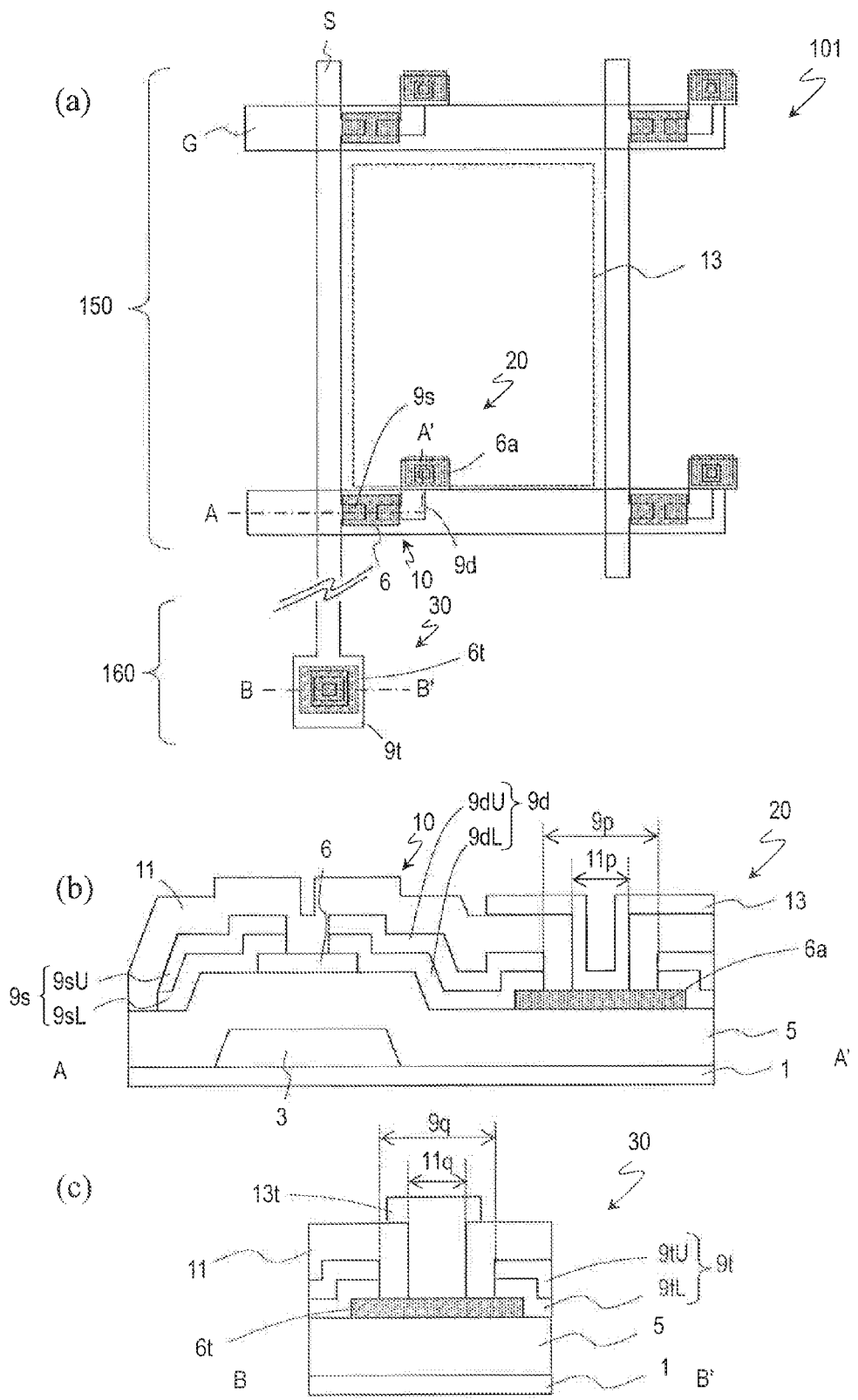
FIG. 2 (a) is a schematic plan view of a TFT substrate 101 according to an embodiment of the present invention. (b) is a cross-sectional view of the TFT substrate 101 shown in (a) as viewed on the plane A-A'. (c) is a cross-sectional view of the TFT substrate 101 shown in (a) as viewed on the plane B-B'.

FIG. 2(a) is a schematic plan view of a TFT substrate 101 according to this embodiment. FIG. 2(b) is a cross-sectional view of the TFT substrate 101 shown in FIG. 2(a) as viewed on the plane A-A' and illustrates a cross-sectional structure of the TFT. FIG. 2(c) is a cross-sectional view of the TFT substrate 101 shown in FIG. 2(a) as viewed on the plane B-B' and illustrates a cross-sectional structure of the terminal portion.

As shown in FIG. 2(a), the TFT substrate 101 includes a display area 150 including a plurality of pixels and an area 160 other than the display area (which will be hereinafter referred to as a "non-display area"). In the display area 150, arranged are a plurality of gate lines G and a plurality of source lines S. And each region surrounded with those lines becomes a "pixel". Those pixels may be arranged in matrix, for example. A pixel electrode 13 is formed in each pixel. In each pixel, a thin-film transistor (TFT) 10 functioning as an active element is formed at each intersection between those source lines S and gate lines G. The drain electrode 9d of each thin-film transistor 10 is electrically connected to the pixel electrode 13 in the drain-pixel electrode connecting portion 20.

In the non-display area 160, a terminal portion 30 is formed to electrically connect the gate line G or source line S to an external line.

As shown in FIG. 2(b), each pixel includes a substrate 1, a thin-film transistor 10 supported on the substrate 1, a protective layer 11 covering the thin-film transistor 10, a pixel electrode (transparent conductive layer) 13 formed on the protective layer 11, a drain-pixel electrode connecting layer (oxide connecting layer) 6a formed out of the same oxide film as the oxide semiconductor layer 6, and a drain-pixel electrode connecting portion 20. The thin-film transistor 10 includes a gate electrode 3 formed on the substrate 1, an oxide semiconductor layer 6 which is formed over the gate electrode 3 with a gate insulating layer 5 interposed between them, and source and drain electrodes 9s and 9d which are electrically connected to the oxide semiconductor layer 6.

In the drain-pixel electrode connecting portion 20, the drain electrode 9d is arranged to be in contact with the drain-pixel electrode connecting layer 6a. The drain-pixel electrode connecting layer 6a is also in contact with the pixel electrode 13. Consequently, the drain electrode 9d and pixel electrode 13 are electrically connected together via the drain-pixel electrode connecting layer 6a. By adopting such a configuration, it is possible to prevent a metal included in the drain electrode 9d from causing an electrolytic corrosion reaction with the transparent conductive layer (i.e., the pixel electrode 13).

As shown in FIG. 2(c), the terminal portion 30 includes a lower connecting layer 6t which is formed out of the same oxide film as the oxide semiconductor layer 6, a source connecting layer 9t which is formed out of the same conductive film as the source and drain electrodes 9s, 9d, and an upper connecting layer 13t which is formed out of the same transparent conductive film as the pixel electrode 13. The upper connecting layer 13t is electrically connected to the source connecting layer 9t via the lower connecting layer 6t. As a result, it is possible to prevent a metal included in the source connecting layer 9t from causing an electrolytic corrosion reaction with the transparent conductive layer (i.e., the pixel electrode 13).

Figure 3:
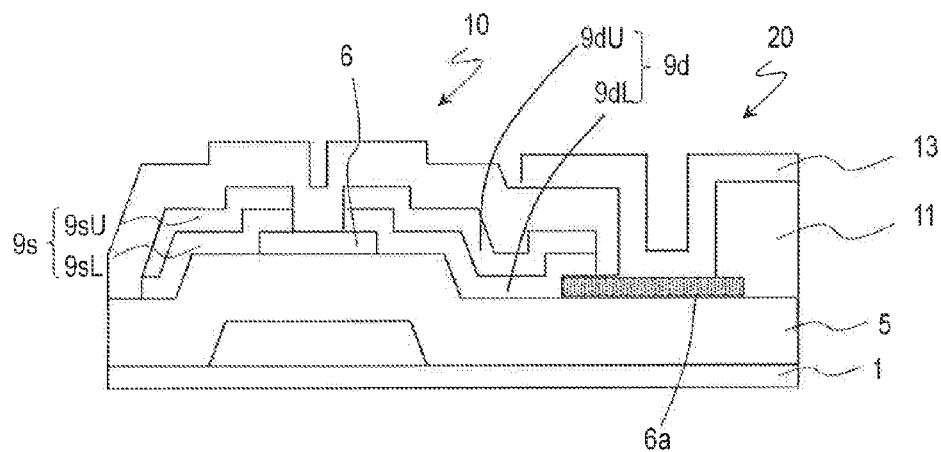
FIG. 3 A cross-sectional view illustrating another exemplary drain-pixel electrode connecting portion for the TFT substrate 101.

In the example shown in FIG. 1, in the drain-pixel electrode connecting portion 20, the protective layer 11 has a hole portion 11p which reaches the upper surface of the drain-pixel electrode connecting layer 6a, and the pixel electrode 13 is in contact with the drain-pixel electrode connecting layer 6a inside the hole portion 11p of the protective layer 11. The drain electrode 9d may cover a portion of the drain-pixel electrode connecting layer 6a. In that case, the hole portion 11p may be cut so as to expose a portion of the drain-pixel electrode connecting layer 6a that is not covered with the drain electrode 9d. Furthermore, as described above, the drain electrode 9d is suitably not directly in contact with the pixel electrode 13. For example, the drain electrode 9d may have a hole 9p, which is located over the drain-pixel electrode connecting layer 6a and the sidewall of which may be covered with the protective layer 11. Alternatively, as shown in FIG. 3, an end portion of the drain electrode 9d may be located on the upper surface of the drain-pixel electrode connecting layer 6a and may have its side surface covered with the protective layer 11.

Likewise, in the terminal portion 30, the protective layer 11 also has a hole portion 11q which is located over the lower connecting layer 6t, and the upper connecting layer 13t is in contact with the lower connecting layer 6t inside the hole portion 11q of the protective layer 11. The source connecting layer 9t may cover a portion of the lower connecting layer 6t. In that case, the hole portion 11q may be cut so as to expose a portion of the lower connecting layer 6t that is not covered with the source connecting layer 9t. Furthermore, the source connecting layer 9t is suitably not directly in contact with the upper connecting layer 13t. As shown in FIG. 1(c), the source connecting layer 9t may have a hole 9q, which is located over the lower connecting layer 6t and the sidewall of which may be covered with the protective layer 11. Alternatively, the source connecting layer 9t may also be arranged so that its end portion is located on the upper surface of the lower connecting layer 6t and has its side surface covered with the protective layer 11.

The drain-pixel electrode connecting layer 6a and lower connecting layer 6t are islanded oxide layers which are formed out of the same oxide semiconductor film as the oxide semiconductor layer 6. These oxide layers have a lower electrical resistance (of $1 \times 10^9$ Ωcm or less, for example) than the oxide semiconductor layer 6. Although it depends on exactly what method is adopted to lower the resistance, the drain-pixel electrode connecting layer 6a and the lower connecting layer 6t may include a dopant (such as argon) at a higher concentration than the oxide semiconductor layer 6.

The source electrode 9s, drain electrode 9d, source connecting layer 9t and source line S may all be formed out of the same metal film. In this description, a layer formed out of the same metal film as the source line S will be hereinafter referred to as a "source line layer". The source line layer of this embodiment is formed as a stack consisting of a lower layer including a barrier metal and an upper layer including a metal which could cause an electrolytic corrosion reaction with the transparent conductive layer. Thus, the source electrode 9s, drain electrode 9d and source connecting layer 9t each consist of a lower layer 9sL, 9dL, 9tL including a barrier metal and an upper layer (such as an Al layer) 9sU, 9dU, 9tU. According to such a configuration, the lower layer 9sL, 9dL including a barrier metal is arranged between the Al layer and the oxide semiconductor layer 6, and therefore, Al can be prevented from diffusing so far as to enter the oxide semiconductor layer 6. In addition, by interposing the drain-pixel electrode connecting layer 6a or lower connecting layer 6t between the Al layer and the transparent conductive layer such as the pixel electrode 13 and upper connecting layer 13t, contact between the Al layer and the transparent conductive layer can be avoided even without partially etching the Al layer. As a result, electrolytic corrosion of Al in the connecting portion can be suppressed. Consequently, compared to a configuration in which only the upper layer (Al layer) needs to be etched selectively as in Patent Document No. 1, the number of photomasks to use can be reduced, which is beneficial.

Figure 4:
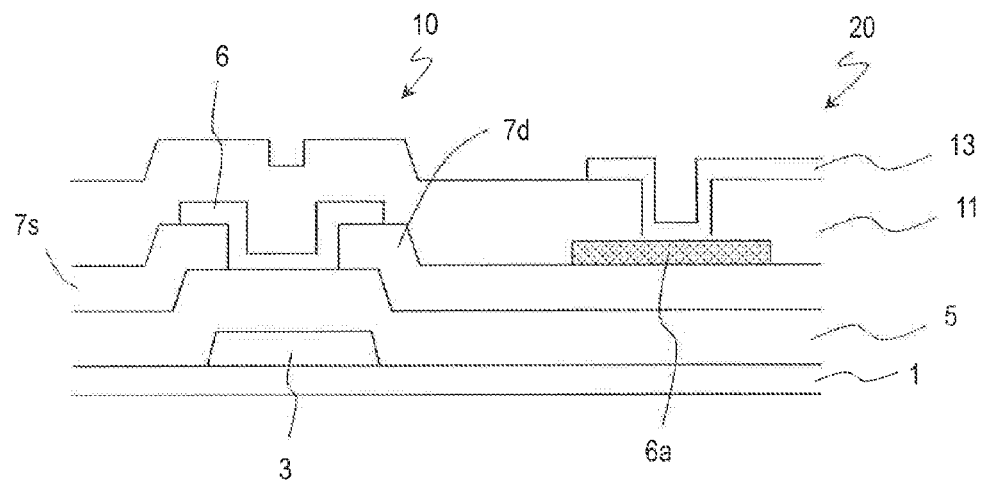
FIG. 4 A cross-sectional view illustrating another exemplary thin-film transistor 10 for the TFT substrate 101.

The structure of the thin-film transistor 10 is not particularly limited. In the thin-film transistor 10 shown in FIG. 2(b), the source and drain electrodes 9s, 9d are arranged on the oxide semiconductor layer 6. However, the source and drain electrodes 9s, 9d may also be arranged closer to the substrate 1 than the oxide semiconductor layer 6 is as shown in FIG. 4. Alternatively, the thin-film transistor 10 may have a top gate structure as well.

Next, respective components of the TFT substrate 100A will be described in detail one by one.

The substrate 1 is typically a transparent substrate and may be a glass substrate, for example, but may also be a plastic substrate. Examples of the plastic substrates include a substrate made of either a thermosetting resin or a thermoplastic resin and a composite substrate made of these resins and an inorganic fiber (such as glass fiber or a non-woven fabric of glass fiber). A resin material with thermal resistance may be polyethylene terephthalate (PET), polyethylene naphthalate (PEN), polyether sulfone (PES), an acrylic resin, or a polyimide resin, for example. Also, when used in a reflective liquid crystal display device, the substrate 1 may also be a silicon substrate.

The gate electrode 3 is electrically connected to a gate line G. Optionally, the gate electrode 3 and the gate line G may form respective parts of the same layer as shown in FIG. 2(a). The gate electrode 3 and gate line G may be made of an element selected from the group consisting of Cu (copper), Al, Cr (chromium), Ta (tantalum), Ti (titanium), Mo (molybdenum) and W (tungsten) or an alloy or metal nitride which is comprised mostly of any of these elements. The gate electrode 3 and gate line G may have a multilayer structure, a single-layer structure, a double-layer structure or a multilayer structure consisting of four or more layers. The gate electrode 3 may have a thickness of approximately 50 to 600 nm, for example.

The gate insulating layer 5 may be a single layer or a multilayer structure of $SiO_2$ (silicon dioxide), $SiN_x$ (silicon nitride), $SiO_xN_y$ (silicon oxynitride, where x>y), $SiN_xO_y$ (silicon nitride oxide, where x>y), $Al_2O_3$ (aluminum oxide), or tantalum oxide ($Ta_2O_5$). The thickness of the gate insulating layer 5 may fall within the range of about 50 nm to about 600 nm. For example, the gate insulating layer 5 may have a multilayer structure consisting of a lower layer made of $SiN_x$ or $SiN_xO_y$ (silicon nitride oxide, where x>y) and an upper layer made of $SiO_2$ or $SiO_xN_y$ (silicon oxynitride, where x>y). In that case, the lower layer can effectively prevent dopants from diffusing from the substrate 1, and the upper layer can minimize deterioration in the semiconductor property of the oxide semiconductor layer 6.

The oxide semiconductor layer 6, the drain-pixel electrode connecting layer 6a and lower connecting layer 6t include an oxide such as IGZO. In this description, IGZO refers herein to an oxide including In (indium), Ga (gallium) and Zn (zinc) and may be any of various In—Ga—Zn—O based oxides. IGZO may be either amorphous or crystalline. If the IGZO is a crystalline one, a crystalline IGZO layer, of which the c-axis is substantially perpendicular to the layer plane, is suitably used. The crystal structure of such an IGZO layer is disclosed, for example, in Japanese Laid-Open Patent Publication No. 2012-134475, the entire disclosure of which is hereby incorporated by reference. The oxide semiconductor layer 6, the drain-pixel electrode connecting layer 6a and lower connecting layer 6t do not have to be made of IGZO, but may also include a Zn—O based (ZnO) oxide, an In—Zn—O based (IZO™) oxide, a Zn—Ti—O based (ZTO) oxide, a Cd—Ge—O based oxide, a Cd—Pb—O based oxide, CdO (cadmium oxide), or an Mg—Zn—O based oxide, for example. The oxide semiconductor layer 6, the drain-pixel electrode connecting layer 6a and lower connecting layer 6t may have a thickness of about 20 nm to about 150 nm, for example.

The source electrode 9s, drain electrode 9d, source line S and source connecting layer (source line layer) 9t may be made of an element selected from the group consisting of Al, Cr, Ta, Ti, Mo and W or an alloy or metal nitride which is comprised mostly of any of these elements. The source line layer may have a single-layer structure, a double-layer structure or a multilayer structure consisting of four or more layers. The source line layer may have a thickness of approximately 50 to 600 nm (e.g., 350 nm), for example. In this embodiment, the source line layer includes a lower layer including a barrier metal and an upper layer including a metal which could cause electrolytic corrosion reaction with a transparent conductive layer. As the barrier metal, a metal such as Ti, Mo or W, an alloy thereof, or a metal nitride thereof may be used. As the metal included in the upper layer, Al, an Al alloy, Ti or a Ti alloy may be used, for example.

Next, it will be described how to fabricate the TFT substrate 101.

FIGS. 5(a) through 5(g) are schematic cross-sectional views illustrating an exemplary series of manufacturing process steps to be performed to fabricate the TFT substrate 101. In each of these cross-sectional views, illustrated is a cross-sectional structure of the thin-film transistor 10 and drain-pixel electrode connecting portion.

It should be noted that the terminal portion has the same cross-sectional structure as, and is formed in the same way as, the drain electrode in the drain-pixel electrode connecting portion, and its illustration is omitted herein. The lower connecting layer, source connecting layer and upper connecting layer in the terminal portion respectively correspond to the oxide connecting layer, drain electrode and pixel electrode in the drain-pixel electrode connecting portion.

First of all, as shown in FIG. 5(a), a gate electrode 3 is formed on the substrate 1. As the substrate 1, a transparent insulating substrate such as a glass substrate may be used, for example. The gate electrode 3 may be formed by depositing a conductive film on the substrate 1 by sputtering process and then patterning the conductive film by photolithographic process. A single-layer film, a multilayer film, an alloy film or a metal nitride film including an element selected from the group consisting of Ti, Mo, Ta, W, Cu, Al and Cr may be used as the conductive film.

Next, as shown in FIG. 5(b), a gate insulating layer is formed by CVD (chemical vapor deposition) process to cover the gate electrode 3. The gate insulating layer 5 may be made of $SiO_2$, $SiN_x$, $SiO_xN_y$ (silicon oxynitride, where x>y). $SiN_xO_y$ (silicon nitride oxide, where x>y), $Al_2O_2$, or $Ta_2O_5$, for example. In this example, a gate insulating layer 5 with a multilayer structure consisting of an $SiN_x$ film as its lower layer and an $SiO_2$ film as its upper layer is formed.

Subsequently, as shown in FIG. 5(c), an oxide semiconductor film 6' is formed by sputtering process on the gate insulating layer 5. In this example, an IGZO film is used as the oxide semiconductor film 6'. The oxide semiconductor film 6' may have a thickness of about 20 nm to about 150 nm.

Thereafter, as shown in FIG. 5(d), the oxide semiconductor film 6' is patterned, thereby obtaining a first oxide semiconductor layer 6 to be an active layer for a TFT, a second oxide semiconductor layer 6a' located in the drain-pixel electrode connecting portion, and a third oxide semiconductor layer (not shown) located in the terminal portion. These three layers have a pattern of mutually isolated islands.

Subsequently, as shown in FIG. 5(e), a source line layer including a source electrode 9s, a drain electrode 9d and a source connecting layer 9t is formed. Specifically, first of all, a metal film (not shown) to be a source line layer is deposited over the first oxide semiconductor layer 6, second oxide semiconductor layer 6a' and third oxide semiconductor layer. In this example, a stack consisting of a lower layer including a barrier metal (which may be a Ti layer with a thickness of about 50 nm, for example) and an upper layer (which may be an Al layer with a thickness of about 200 nm, for example) is formed as the stack. Next, the metal film is patterned, thereby obtaining source and drain electrodes 9s, 9d to be in contact with the first oxide semiconductor layer 6 and a source connecting layer (not shown) located in the terminal portion. In this embodiment, the drain electrode 9d is arranged to be in contact with the upper surface of the second oxide semiconductor layer 6a' and has a hole 9p which partially exposes the upper surface of the second oxide semiconductor layer 6a'. Likewise, the source connecting layer is also arranged to be in contact with the upper surface of the third oxide semiconductor layer located in the terminal portion and has a hole which partially exposes the upper surface of the third oxide semiconductor layer.

Thereafter, as shown in FIG. 5(f), a protective layer 11 is formed. Specifically, first of all, a protective film (passivation film) is deposited over the source line layer. In this example, an $SiO_2$ film (with a thickness of 200 nm, for example) is formed as the protective film. The protective film is also deposited on the second oxide semiconductor layer 6a' and inside the hole portion of the third oxide semiconductor layer. Then, the protective film is patterned, thereby cutting a hole portion 11p which exposes the upper surface of the second oxide semiconductor layer 6a' and a hole portion (not shown) which exposes the upper surface of the third oxide semiconductor layer. In this case, when viewed along a normal to the substrate 1, the hole portion 11p of the protective layer 11 is suitably located inside the hole 9p of the drain electrode 9d. Thus, the protective layer 11 can also be formed on the sidewall of the hole 9p. Consequently, it is possible to prevent effectively a metal included in the source line layer from being in contact with a transparent conductive material to be deposited later.

Next, the second oxide semiconductor layer 6a' and third oxide semiconductor layer are subjected to a resistance lowering process L with the protective layer 11 used as a mask. As a result, at least a portion of the second oxide semiconductor layer 6a' comes to have lower resistance, thus forming a drain-pixel electrode connecting layer 6a. Meanwhile, the first oxide semiconductor layer 6 does not have its resistance lowered. Although not shown, at least a portion of the third oxide semiconductor layer also comes to have lower resistance, thus forming a lower connecting layer.

Examples of the resistance lowering process L include plasma processing and doping a p-type dopant or an n-type dopant. If a region to have lower resistance is doped with either a p-type dopant or an n-type dopant, the dopant concentration in the drain-pixel electrode connecting layer 6a and lower connecting layer becomes higher than the dopant concentration in the first oxide semiconductor layer 6 that has not had its resistance lowered.

Figure 6:
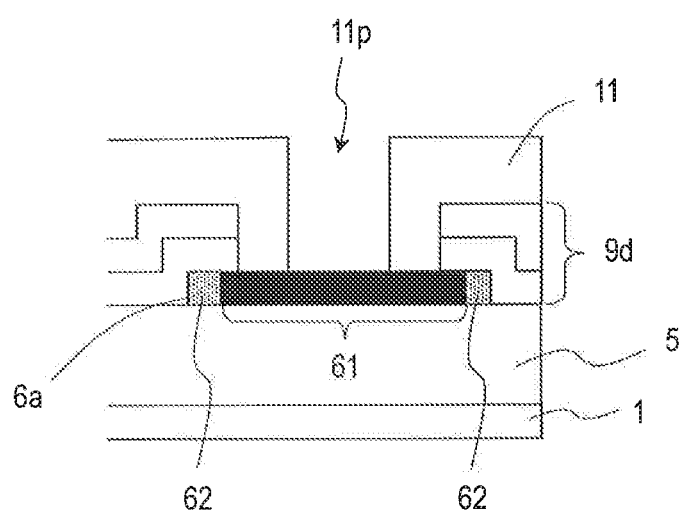

FIG. 6 is an exemplary enlarged cross-sectional view illustrating the drain-pixel electrode connecting layer 6a. As a result of the resistance lowering process, diffusion of dopants lowers the resistance in not only a portion of the second oxide semiconductor layer 6a' which is exposed by the hole portion 11p but also its surrounding portion, i.e., a portion covered with the protective layer 11 and source line layer, thus turning those portions into resistance-lowered regions 61. Meanwhile, the region that has not had its resistance lowered is left as a semiconductor region 62. Since a portion of the drain-pixel electrode connecting layer 6a which is in contact with the drain electrode 9d also has its resistance lowered as shown in FIG. 6, the drain-pixel electrode connecting layer 6a and drain electrode 9d can be electrically connected together. Likewise, although not shown, a portion of the lower connecting layer 6t which is in contact with the source connecting layer also has its resistance lowered, and therefore, the lower connecting layer and the source connecting layer can be electrically connected together.

In this embodiment, hydrogen plasma processing using a CVD system is carried out as the resistance lowering process L. For example, by setting the power of the CVD system to be 0.1 kW, the pressure 200 Pa, the hydrogen flow rate 1000 sccm, the temperature 220° C., the process time 300 sec, and the distance between electrodes (E/S distance) 25 mm, respectively, the resistivity of IGZO which was equal to or greater than $1 \times 10^{12}$ Ωcm before the process can be lowered to around $1 \times 10^8$ Ωcm. It should be noted that the process condition described above is just an example and any other appropriate condition could be selected as well.

As the resistance lowering process L, any other processing method such as a method in which plasma processing is carried out with hydrogen or argon introduced using a dry etching system or a sputtering apparatus may also be adopted. A method of forming an oxide layer with low resistance through such a resistance lowering process is disclosed in Japanese Laid-Open Patent Publication No. 2010-243594, the entire disclosure of which is hereby incorporated by reference.

Thereafter, as shown in FIG. 5(g), a transparent conductive film is deposited (to a thickness of 100 nm, for example) on the protective layer 11 and inside the hole portion 11p of the protective layer 11 and then patterned, thereby forming a pixel electrode 13. As the transparent conductive film, an ITO film or an IZO film may be used, for example. The pixel electrode 13 contacts with the drain-pixel electrode connecting layer 6a inside the hole portion 11p. Although not shown, an upper connecting layer for the terminal portion is also formed out of this transparent conductive film simultaneously with the pixel electrode 13. The upper connecting layer contacts with the lower connecting layer inside the hole portion formed in the protective layer 11.

According to the method described above, electrolytic corrosion of a metal included in the source line layer can be suppressed in the connecting portion which connects the source line layer (i.e., the drain electrode and the source connecting layer) and the transparent conductive layer together without increasing the number of manufacturing process steps or the number of masks to use. Consequently, a high-performance and high-reliability semiconductor device can be provided with an increase in the resistance of the connecting portion due to electrolytic corrosion of an electrode minimized.

Next, another embodiment of a semiconductor device according to the present invention will be described with reference to the accompanying drawings.

Figure 7:
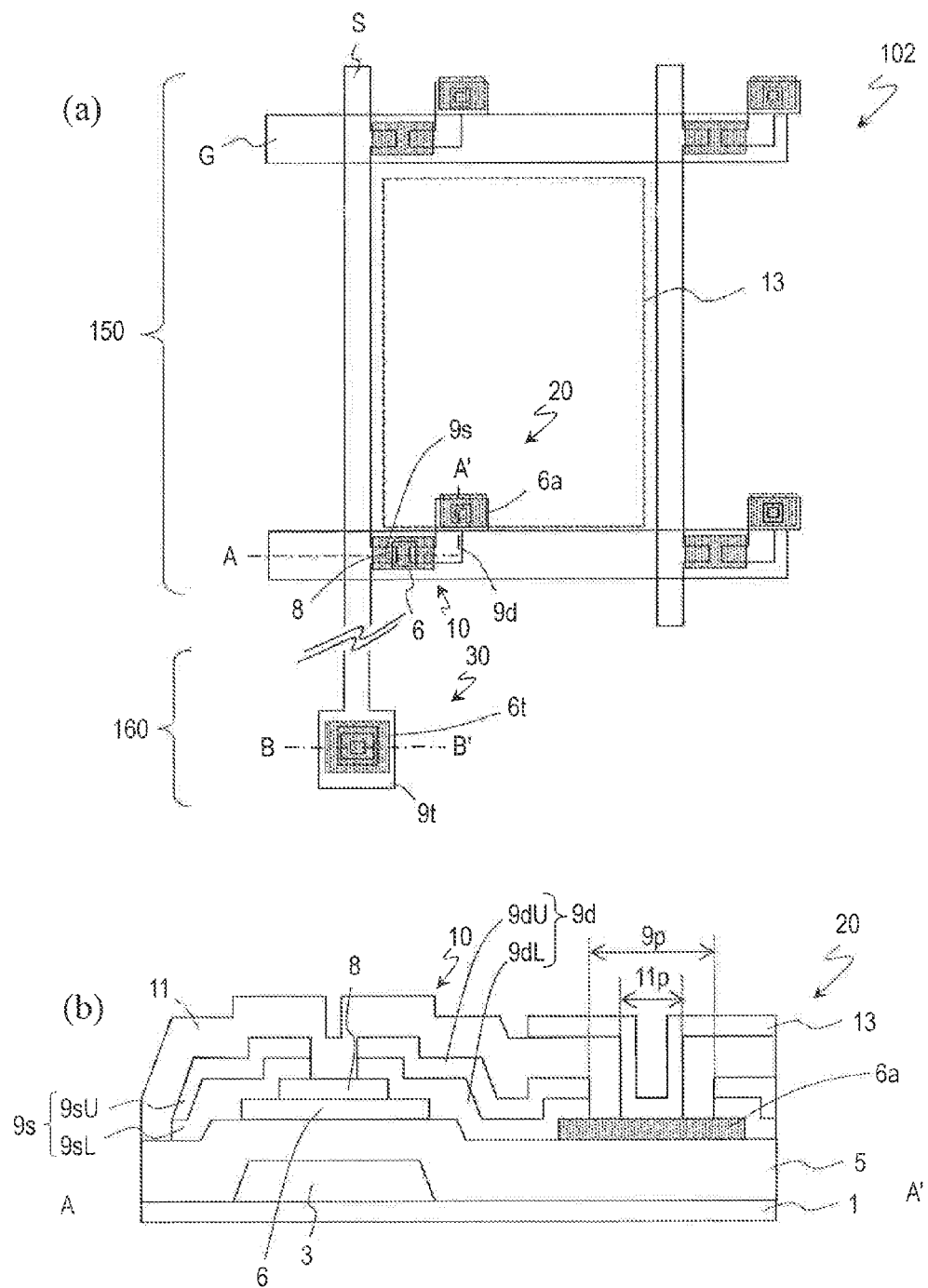
FIG. 7 (a) is a schematic plan view illustrating a TFT substrate 102 according to an embodiment of the present invention. (b) is a cross-sectional view of the TFT substrate 102 shown in (a) as viewed on the plane A-A'.

FIG. 7(a) is a schematic plan view illustrating a TFT substrate 102 according to this embodiment. FIG. 7(b) is a cross-sectional view of the TFT substrate 102 shown in FIG. 7(a) as viewed on the plane A-A' and illustrates a cross-sectional structure of the TFT. In FIG. 7, any component also shown in FIG. 2 and having substantially the same function as its counterpart is identified by the same reference numeral as its counterpart's and description thereof will be omitted herein. No cross-sectional view of the terminal portion is provided because the terminal portion has the same structure as the one shown in FIG. 2(c).

This TFT substrate 102 includes an etch stop layer which covers at least the channel region of the oxide semiconductor layer 6, which is a major difference from the TFT substrate 101. The etch stop layer 8 can prevent the channel region from getting damaged when an etching process step is performed to form source and drain electrodes 9s and 9d. In addition, as will be described later, the resistance lowering process L can also be carried out with the etch stop layer 8 used as a mask. As a result, the drain-pixel electrode connecting layer 6a and lower connecting layer 6t can have their resistance lowered in their entirety, and therefore, the resistance between these connecting layers and the source line layer can be reduced.

The etch stop layer 8 may be a silicon dioxide film, a silicon nitride film, a silicon oxynitride film or a stack thereof.

Next, it will be described how to fabricate this TFT substrate 102.

FIGS. 8(a) through 8(e) are schematic cross-sectional views illustrating an exemplary series of manufacturing process steps to be performed to fabricate the TFT substrate 102. In each of these cross-sectional views, illustrated is a cross-sectional structure of the TFT and drain-pixel electrode connecting portion. It should be noted that the terminal portion has the same cross-sectional structure as, and is formed in the same way as, the drain electrode in the drain-pixel electrode connecting portion, and its illustration is omitted herein. The lower connecting layer, source connecting layer and upper connecting layer in the terminal portion respectively correspond to the oxide connecting layer, drain electrode and pixel electrode in the drain-pixel electrode connecting portion.

Figure 5:
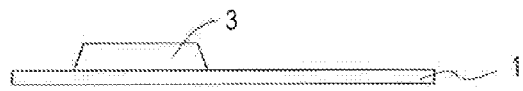
FIG. 5 (a) through (g) are schematic cross-sectional views illustrating respective manufacturing process steps to be performed to fabricate a TFT substrate 101 according to an embodiment of the present invention.
Figure 5:
Figure 5:
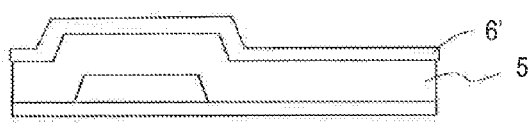
Figure 5:
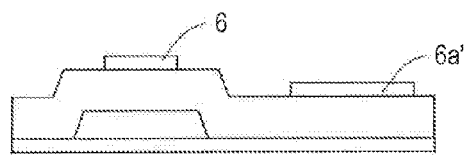
Figure 5:
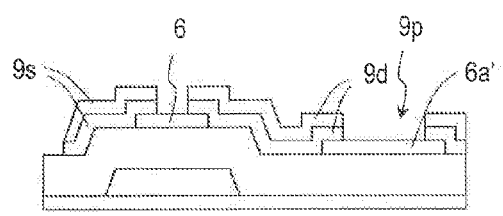
Figure 5:
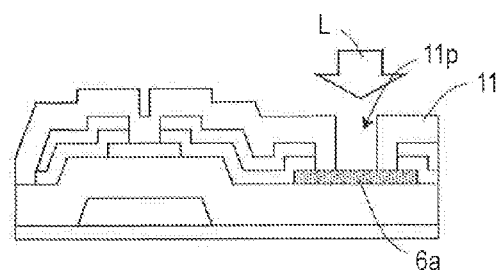
Figure 5:
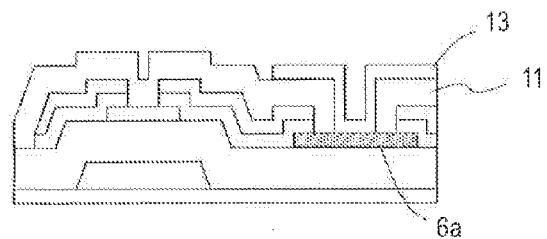
Figure 8:
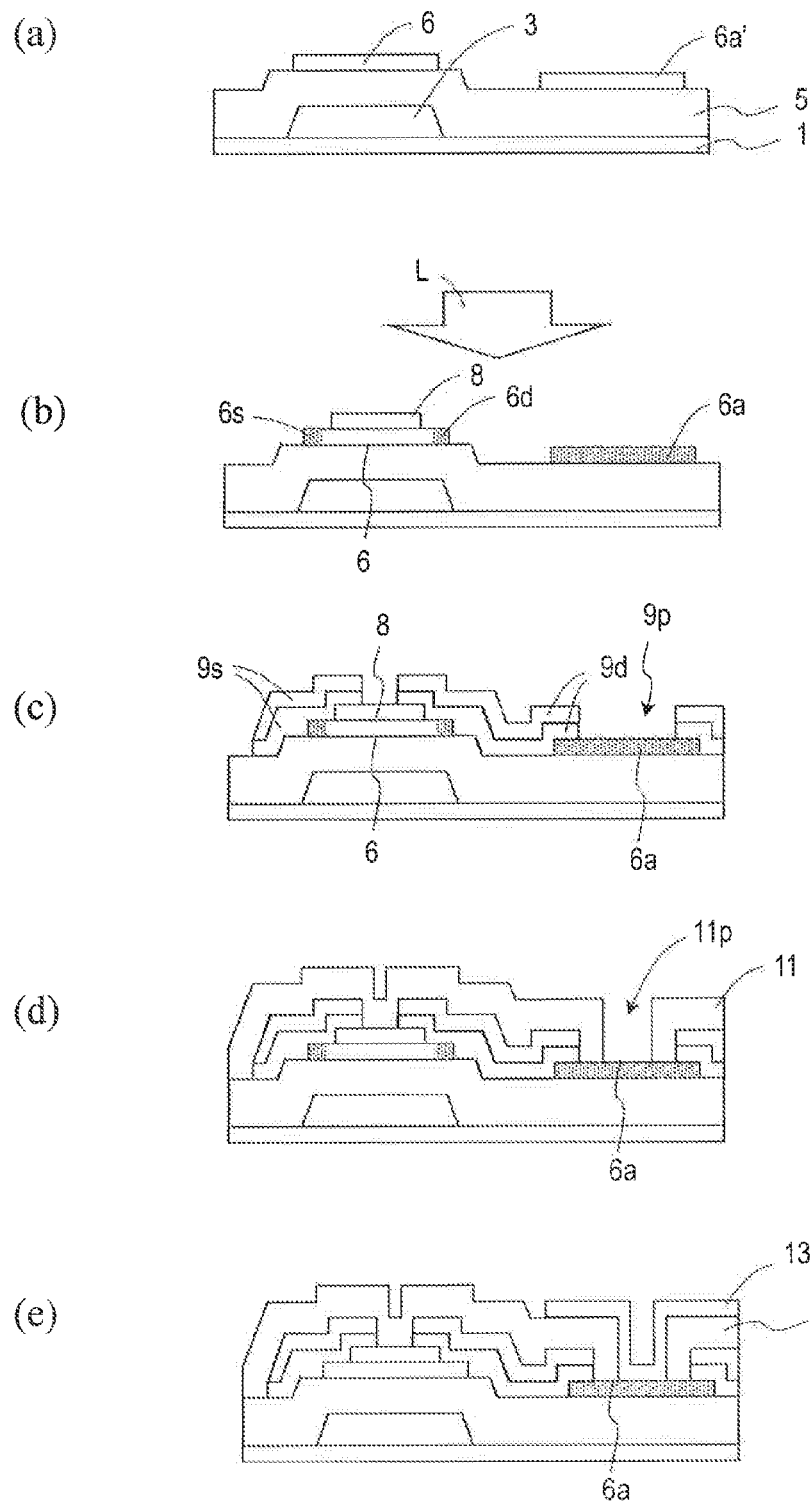
FIG. 8 (a) through (e) are schematic cross-sectional views illustrating respective manufacturing process steps to be performed to fabricate a TFT substrate 102 according to an embodiment of the present invention.
Figure 9:
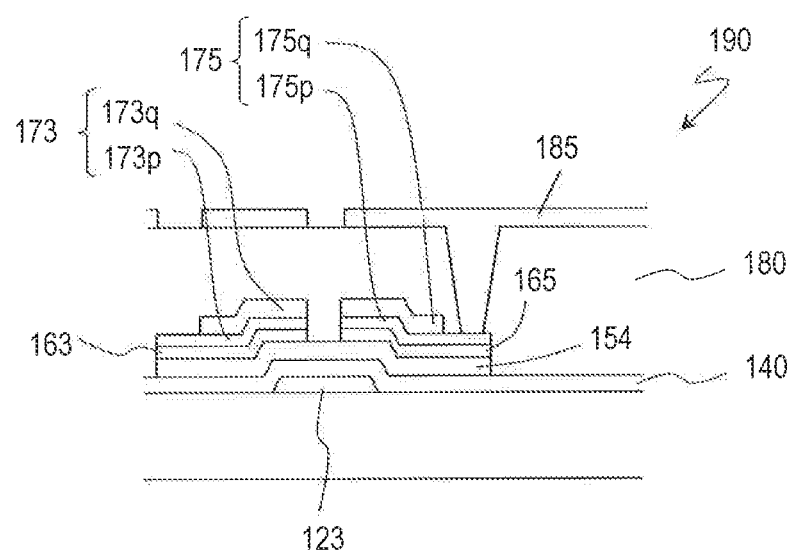
FIG. 9 A cross-sectional view illustrating the configuration of the semiconductor device disclosed in Patent Document No. 1.

First of all, as shown in FIG. 8(a), a gate electrode 3, a gate insulating layer 5, a first oxide semiconductor layer 6, a second oxide semiconductor layer 6a' and a third oxide semiconductor layer (not shown) for a terminal portion are formed on the substrate 1 in the same way as already described with reference to FIG. 5.

Next, as shown in FIG. 8(b), an etch stop layer 8 is formed so as to cover at least the channel region of the first oxide semiconductor layer 6. In this example, a silicon dioxide film (SiO$_2$ film) is deposited as the etch stop layer 8 to a thickness of 100 nm, for example, by CVD process.

Subsequently, with the etch stop layer 8 used as a mask, the first oxide semiconductor layer 6, second oxide semiconductor layer 6a' and third oxide semiconductor layer are subjected to a resistance lowering process L. As a result, the second oxide semiconductor layer 6a' comes to have lower resistance to be a drain-pixel electrode connecting layer 6a. In the same way, the third oxide semiconductor layer also comes to have lower resistance to be a lower connecting layer (not shown). In addition, portions of the first oxide semiconductor layer 6 which are not covered with the etch stop layer 8 (i.e., portions which are in contact with the source and drain electrodes) also have their resistance lowered to be a source contact region 6s and a drain contact region 6d, respectively.

Thereafter, as shown in FIG. 8(c), a source line layer including a source electrode 9s, a drain electrode 9d and a source line layer (not shown) is formed. The source line layer may be formed in the same way as already described with reference to FIG. 5, for example.

Subsequently, as shown in FIG. 8(d), a protective layer 11 is formed to cover the source line layer. A hole portion 11p to expose the upper surface of the drain-pixel electrode connecting layer 6a and a hole portion (not shown) to expose the upper surface of the lower connecting layer are cut through the protective layer 11. The protective layer 11 may be formed in the same way as already described with reference to FIG. 5, for example.

Next, as shown in FIG. 8(e), a pixel electrode 13 and an upper connecting layer (not shown) are formed. The pixel electrode 13 and upper connecting layer 13t may be formed in the same way as already described with reference to FIG. 5, for example. In this manner, a TFT substrate 102 is completed.

According to the method described above, electrolytic corrosion of a metal included in the source line layer can be suppressed without complicating the manufacturing process. In addition, the channel region of the oxide semiconductor layer 6 can be prevented from getting damaged through an etching process step to form the source line layer. Furthermore, since the drain-pixel electrode connecting layer 6a and lower connecting layer can have their resistance lowered in their entirety, the resistance in the connecting portion can be reduced to an even lower level. On top of that, since portions of the oxide semiconductor layer 6 which are in contact with the source and drain electrodes 9s and 9d also have their resistance lowered, the ON-state resistance of the TFT can be reduced.

According to the method described above, the resistance lowering process L is carried out after the etch stop layer 8 is formed and before the source line layer is formed. However, as in the method that has already been described with reference to FIG. 5, the resistance lowering process L may also be carried out after the protective layer 11 is formed. Alternatively, the resistance lowering process L may also be carried out after the source line layer is formed and before the protective layer 11 is formed. In this resistance lowering process L, the source line layer and the etch stop layer 8 are used as a mask. In that case, compared to a situation where the resistance lowering process L is carried out with the protective layer 11 used as a mask after the protective layer 11 is formed, the ratio of the resistance lowered region to the entire oxide connecting layer can be increased and the resistance in the connecting portion can be further reduced.

It should be noted that a semiconductor device according to an embodiment of the present invention just needs to include at least one connecting portion to electrically connect the metal layer and the transparent conductive layer together using an oxide connecting layer that uses the same oxide film as the oxide semiconductor layer. And the configurations of the embodiments described above are just examples. In the TFT substrates 101, 102, the oxide connecting layer is supposed to be interposed between the metal layer (i.e., the drain electrode 9d and source connecting layer 9t) and the transparent conductive layer (i.e., the pixel electrode 13 and upper connecting layer 13t) in both of the drain-pixel electrode connecting portion 20 and terminal portion 30. However, the oxide connecting layer may be interposed in only one of the drain-pixel electrode connecting portion 20 and the terminal portion 30.

INDUSTRIAL APPLICABILITY

The present invention is applicable broadly to various types of devices that use a thin-film transistor. Examples of such devices include circuit boards such as an active-matrix substrate, display devices such as a liquid crystal display, an organic electroluminescence (EL) display, and an inorganic electroluminescence display, image capture devices such as an image sensor, and electronic devices such as an image input device and a fingerprint scanner.

REFERENCE SIGNS LIST 1 substrate
3 gate electrode
5 gate insulating layer
6 oxide semiconductor layer 6a drain-pixel electrode connecting layer (oxide connecting layer)
6t lower connecting layer (oxide connecting layer)
8 etch stop layer
9s source electrode
9d drain electrode (metal layer)
9t source connecting layer (metal layer)
10 thin-film transistor
11, 111 protective layer
13, 113 pixel electrode (transparent conductive layer)
13t upper connecting layer (transparent conductive layer)
20 drain-pixel electrode connecting portion
30 terminal portion
101, 102 semiconductor device (TFT substrate)
120 connecting portion

The invention claimed is:

1. A semiconductor device comprising:
   a substrate;
   a thin-film transistor which is supported on the substrate and which includes an oxide semiconductor layer as its active layer;
   a protective layer covering the thin-film transistor;
   a metal layer interposed between the protective layer and the substrate;
   a transparent conductive layer formed on the protective layer; and
   a connecting portion to electrically connect the metal layer and the transparent conductive layer together,
   wherein the connecting portion includes an oxide connecting layer which is formed out of a same oxide film as the oxide semiconductor layer and which has a lower electrical resistance than the oxide semiconductor layer, and
   the metal layer is electrically connected to the transparent conductive layer via the oxide connecting layer.

2. The semiconductor device of claim 1, wherein the protective layer has a hole portion which is located over the oxide connecting layer, and
   the transparent conductive layer is in contact with the oxide connecting layer inside the hole portion of the protective layer.

3. The semiconductor device of claim 1, wherein in the connecting portion, the transparent conductive layer is not directly in contact with the metal layer.

4. The semiconductor device of claim 3, wherein the metal layer has a hole over the oxide connecting layer and a sidewall of the hole is covered with the protective layer.

5. The semiconductor device of claim 1, wherein the connecting portion is a drain-pixel electrode connecting portion, the metal layer is a drain electrode of the thin film transistor, and the transparent conductive layer is a pixel electrode.

6. The semiconductor device of claim 1, wherein the connecting portion is a terminal portion, and
   the metal layer is a source connecting layer which is formed out of a same conductive film as source and drain electrodes of the thin film transistor.

7. The semiconductor device of claim 1, wherein the metal layer includes a metal which is able to cause electrolytic corrosion reaction with the transparent conductive layer.

8. The semiconductor device of claim 7, wherein the metal layer includes aluminum.

9. The semiconductor device of claim 8, wherein the metal layer has a multilayer structure including a lower layer and an upper layer, the lower layer including a barrier metal, the upper layer including aluminum.

10. The semiconductor device of claim 1, wherein the oxide semiconductor layer and the oxide connecting layer include In, Ga and Zn.

11. The semiconductor device of claim 10, wherein the oxide semiconductor layer and the oxide connecting layer include a crystalline In—Ga—Zn—O based oxide.

12. The semiconductor device of claim 1, wherein the thin-film transistor further includes an etch stop layer which is in contact with a channel region of the oxide semiconductor layer.

13. A method for fabricating the semiconductor device of claim 12, the method comprising the steps of:
   (a) providing a substrate, on which a gate electrode and a gate insulating layer are formed;
   (b) forming an oxide semiconductor film on the gate insulating layer and patterning the oxide semiconductor film, thereby forming a first oxide semiconductor layer to be an active layer for a thin-film transistor and a second oxide semiconductor layer to be an oxide connecting layer;
   (c) forming an etch stop layer to contact with the first oxide semiconductor layer at least partially;
   (d) performing a resistance lowering process to lower a resistance of the second oxide semiconductor layer, thereby turning the second oxide semiconductor layer into an oxide connecting layer;
   (e) forming a metal layer to cover the oxide connecting layer partially;
   (f) forming a protective layer over the metal layer and forming, in the protective layer, a hole portion exposing at least partially a portion of the oxide connecting layer that is not covered with the metal layer; and
   (g) forming a transparent conductive film over the protective layer and inside the hole portion and patterning the transparent conductive film, thereby forming a transparent conductive layer to contact with the oxide connecting layer inside the hole portion.

14. The method of claim 13, wherein the oxide semiconductor film includes In, Ga and Zn.

15. The method of claim 14, wherein the oxide semiconductor film includes a crystalline In—Ga—Zn—O based oxide.

16. A method for fabricating the semiconductor device of claim 1, the method comprising the steps of:
   (A) providing a substrate, on which a gate electrode and a gate insulating layer are formed;
   (B) forming an oxide semiconductor film on the gate insulating layer and patterning the oxide semiconductor film, thereby forming a first oxide semiconductor layer to be an active layer for a thin-film transistor and a second oxide semiconductor layer to be an oxide connecting layer;
   (C) forming a metal layer to cover the second oxide semiconductor layer partially;
   (D) forming a protective layer over the metal layer and forming in the protective layer, a hole portion exposing at least partially a portion of the second oxide semiconductor layer that is not covered with the metal layer;
   (E) performing a resistance lowering process to lower a resistance of that portion of the second oxide semiconductor layer that is exposed by the hole portion, thereby turning the second oxide semiconductor layer into an oxide connecting layer; and (F) forming a transparent conductive film over the protective layer and inside the hole portion and patterning the transparent conductive film, thereby forming a transparent conductive layer to contact with the oxide connecting layer inside the hole portion.

17. The method of claim 16, wherein the oxide semiconductor film includes In, Ga and Zn.

18. The method of claim 17, wherein the oxide semiconductor film includes a crystalline In—Ga—Zn—O based oxide.

* * * * *